United States Patent [19]
Murphy et al.

[11] Patent Number: 5,763,885
[45] Date of Patent: Jun. 9, 1998

[54] METHOD AND APPARATUS FOR THERMAL GRADIENT STABILIZATION OF MICROBOLOMETER FOCAL PLANE ARRAYS

[75] Inventors: Robert H. Murphy, Franklin; Neal E. MacDonald, Westford, both of Mass.; John D. Ramsden, Sunnyvale, Calif.

[73] Assignee: Loral Infrared & Imaging Systems, Inc., Lexington, Mass.

[21] Appl. No.: 574,815

[22] Filed: Dec. 19, 1995

[51] Int. Cl.$^6$ .......................................................... G01J 5/16
[52] U.S. Cl. ...................... 250/352; 250/332; 250/370.15
[58] Field of Search .............................. 250/352, 370.15, 250/332, 370.08, 370.09, 208.1

[56] References Cited

U.S. PATENT DOCUMENTS

| | | |
|---|---|---|
| 3,621,258 | 11/1971 | Dreitzler et al. . |
| 4,230,945 | 10/1980 | Meir et al. ........................ 250/370.15 |
| 4,555,626 | 11/1985 | Suzuki . |
| 4,880,979 | 11/1989 | Yoshida ........................ 250/370.15 X |
| 4,990,782 | 2/1991 | Wellman et al. . |
| 4,995,236 | 2/1991 | Rouqvier et al. .................... 250/352 X |
| 5,041,723 | 8/1991 | Ishida et al. . |
| 5,041,727 | 8/1991 | Kojima et al. . |
| 5,049,751 | 9/1991 | Yoshida et al. ........................ 250/352 |
| 5,075,555 | 12/1991 | Woldseth et al. . |
| 5,081,358 | 1/1992 | Yoshikawa . |
| 5,227,631 | 7/1993 | Hunter, III et al. . |
| 5,231,289 | 7/1993 | Kita et al. . |
| 5,371,376 | 12/1994 | Iwanczyk . |
| 5,420,419 | 5/1995 | Wood . |
| 5,486,689 | 1/1996 | Hanson et al. ........................ 250/332 |

FOREIGN PATENT DOCUMENTS

| | | |
|---|---|---|
| A-2 154 693 | 9/1972 | France . |
| 61-195315 | 8/1986 | Japan ........................ 250/352 |
| 5-256693 | 10/1993 | Japan ........................ 250/352 |
| WO 88/04833 | 6/1988 | WIPO . |
| WO 92/06561 | 4/1992 | WIPO . |
| WO 94/00950 | 1/1994 | WIPO . |

OTHER PUBLICATIONS

International Search Report from International Patent Application PCT/US 96/20352, filed Dec. 18, 1996.

*Primary Examiner*—Edward J. Glick
*Attorney, Agent, or Firm*—Wolf, Greenfield & Sacks, P.C.

[57] ABSTRACT

A thermal shunt apparatus directs heat flux transmitted through electrical signal leads from a focal plane array (FPA) to a relatively isothermal top surface of a TE cooler. The FPA mounts with a first thermally conductive attachment to a thermal spreader plate that is highly thermally conductive. The thermal spreader plate is mounted to the top surface of the TE cooler by a second thermally conductive attachment. The combination of the relatively isothermal surfaces, the FPA thermal spreader and the TE cooler top plate, separated by the thermally conductive interface, maintains a relatively constant temperature difference between the electrical leads connected between the thermal shunt and the FPA edge. The constant temperature difference provides for constant heat flux between these points and a constant temperature gradient across the surface of the FPA.

61 Claims, 3 Drawing Sheets

METHOD AND APPARATUS FOR THERMAL GRADIENT STABILIZATION OF MICROBOLOMETER FOCAL PLANE ARRAYS

FIELD OF THE INVENTION

The present invention relates generally to thermal gradient stabilization of thermally sensitive devices, and more particularly, to a method and apparatus for thermal gradient stabilization of microbolometer focal plane arrays.

BACKGROUND OF THE INVENTION

A microbolometer focal plane array (FPA) can produce imagery for various applications. Microbolometer FPA performance, because of the extreme sensitivity of microbolometers, may be affected by even small noise sources. For example, minute temperature variations, such as thermal gradients, occurring on the FPA may detrimentally affect the imagery produced. Mismatched sensitivities among bolometers in the FPA produce fixed pattern noise as well as gradients in apparent scene brightness. Furthermore, temperature fluctuations and temperature gradients in the FPA may exacerbate imagery problems caused by fixed pattern noise.

In order to counteract effects of ambient temperature changes in the FPA, microbolometer FPAs may advantageously be thermally stabilized. Thermoelectric (TE) coolers have been employed for temperature compensation in FPAs in tracking systems. This method has been very effective for maintaining the FPA at a very precisely controlled temperature during external ambient temperature excursions.

Despite the use of such TE coolers, stability problems remain. The microbolometer FPA electrically connects to off-chip control and power electronics through wire leads routed through a device package. Heat conducted by the wire leads detrimentally effects the temperature stability of a microbolometer FPA. During external ambient temperature excursions this heat flux varies as a function of the temperature difference between the device package, at the external ambient temperature, and the controlled FPA temperature. The varying heat flux imparts a varying temperature gradient across the surface of the FPA. Although the temperature of the FPA may be precisely controlled, the known apparatus does not provide for control of the temperature gradient across the surface of the FPA.

SUMMARY OF THE INVENTION

The invention provides a thermal shunt that directs heat flux, conducted from electrical signal leads, from the focal plane array to a relatively isothermal top surface of a thermoelectric (TE) cooler. The FPA mounts with a first thermally conductive attachment to a thermally conductive thermal spreader plate. The thermal spreader plate mounts to the top surface of the TE cooler by a second thermally conductive attachment that is advantageously less thermally conductive than the spreader plate. The combination of the two relatively isothermal surfaces, the FPA thermal spreader and the TE cooler top plate, separated by the less thermally conductive interface, substantially maintains a relatively constant temperature difference between the electrical leads connected between the thermal shunt and the FPA edge. The substantially relatively constant temperature difference provides for constant heat flux between these points and a constant temperature gradient across the surface of the FPA.

In one aspect of the invention, a vacuum housing helps shield the system from external environmental conditions. The vacuum housing includes a window disposed above the FPA to allow radiation to fall on the FPA.

DETAILED DESCRIPTION OF THE PREFERRED EMBODIMENT

Figure 1:
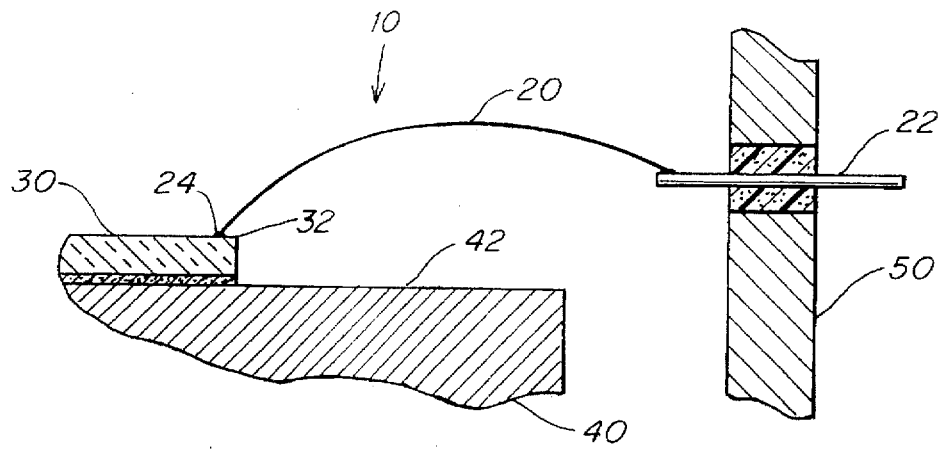
FIG. 1 shows a partial cross section of a prior art FPA mounting.

FIG. 1 shows a partial cross section of a typical prior art FPA system 10 and connecting electrical leads 20. An FPA 30 mounts directly on a thermoelectric cooler 40 top surface 42. Wire bonded electrical leads 20 run directly from hermetically sealed electrical feedthroughs 22 in a vacuum housing 50 to bond pads 24 on the FPA 30. As heat flows into or out of the vacuum housing 50, depending on the external environmental temperature, the temperature of the FPA edge 32 changes with respect to the average FPA surface temperature. The TE cooler 40 and a temperature controller (not shown) do not compensate for this change in thermal gradient, consequently degrading system performance.

Figure 2:
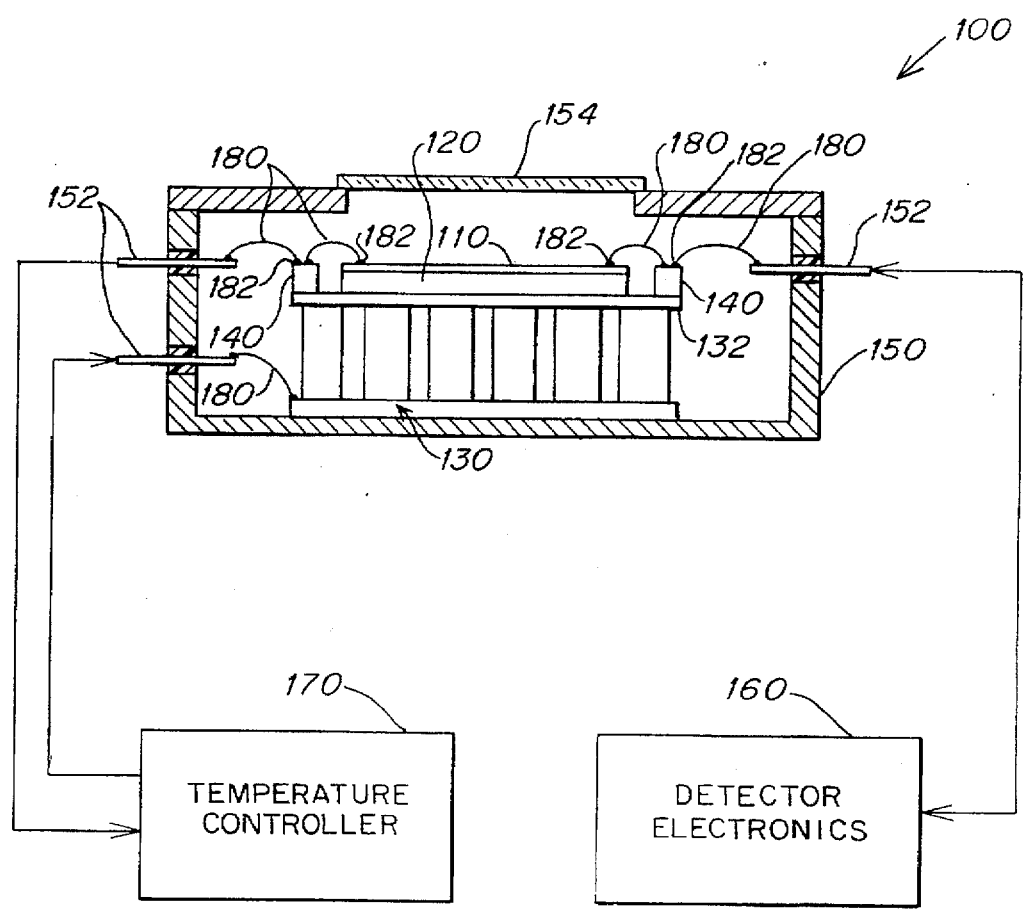
FIG. 2 shows a cross section of the microbolometer FPA mounted in the vacuum housing.
Figure 3:
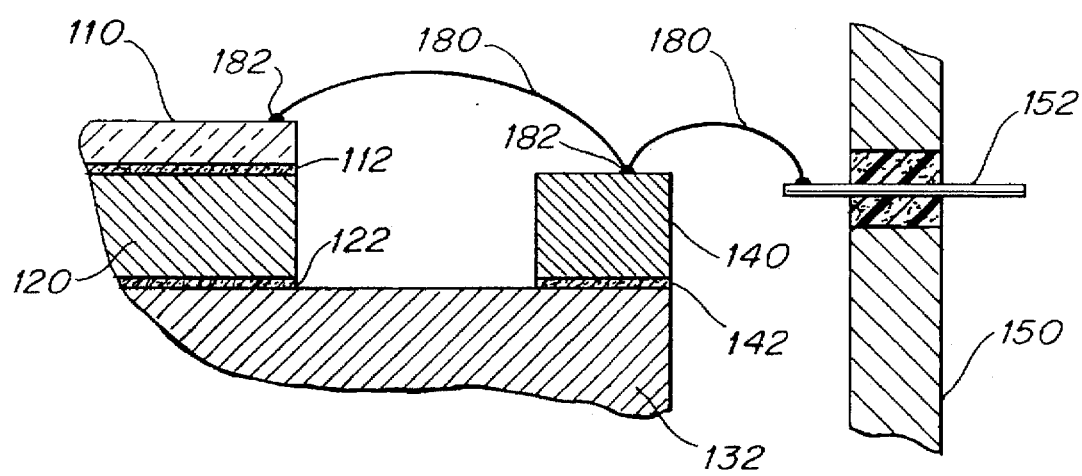
FIG. 3 shows a detailed cross section of the microbolometer FPA mounted on the temperature stabilization apparatus.

Refer now to FIG. 2, which shows a cross section view of one embodiment of the thermal gradient stabilizing apparatus of microbolometer FPA assembly 100 and FIG. 3 which shows a partial cross section of one embodiment of the invention in greater detail. An FPA 110 mounts to a thermal spreader 120 using a first thermally conducting attachment 112. In one embodiment, the thermal spreader 120 may be made from copper or a similarly thermally conductive material. In one example the first thermally conducting attachment may comprise an adhesive such as, for example, a 1 mil thick layer of A. I. Technology's part number EG8050 adhesive or similar known adhesives. The thermal spreader 120 mounts to a first side of a thermoelectric cooler 130 using a second thermally conductive attachment 122 where the second thermally conductive attachment preferably, but not necessarily, comprises a less thermally conductive material than the first thermally conductive attachment. In one example, the less thermally conductive material may comprise Furane's uralane 5753 adhesive or a similar known adhesive material. In one embodiment, the first thermally conductive material may comprise a material having a conductance of about 0.08 Watts/cm°K. The second thermally conductive material may comprise, for example, a material having a conductance of about 0.002 Watts/cm°K. In one embodiment the second thermally conductive material may have a conductance less than 0.1 Watts/cm°K.

The first side of the thermoelectric cooler 130 may include a top plate 132. Thermal shunts 140 mount to the TE cooler top plate 132 using a thermally conductive attachment 142 similar to the first thermally conductive attachment. In one embodiment, the TE cooler top plate 132 may comprise beryllium oxide or a similarly thermally conductive material. Likewise, the thermal shunts may comprise silicon or a similarly thermally conductive material.

Electrical leads 180 carry signals from the microbolometer FPA assembly 100. An electrical lead 180 may attach at one end to the FPA 110 and at a second end to a thermal shunt 140. A second electrical lead 180 may attach at a first end to the thermal shunt 140 and at a second end to an electrical feedthrough 152. Those skilled in the art, having the benefit of this disclosure, will appreciate that the first and second electrical leads may comprise a single stitched electrical lead.

The microbolometer FPA assembly 100 may be housed in a hermetically sealed vacuum housing 150. The vacuum housing 150 includes a window 154 disposed to allow radiant energy to enter the system and illuminate the FPA 110. The TE cooler 130 may be mounted on a second side to the vacuum housing 150 using a thermally conducting attachment method. The microbolometer FPA assembly 100 may interface with outside electronics through electrical feedthroughs 152. In one embodiment of the invention the outside electronics may comprise detector electronics 160 and a temperature controller 170.

The temperature controller 170 receives a feedback input signal from the FPA 110 as a function of the temperature of the FPA 110. The temperature controller 170 processes this input feedback signal and generates an output signal to control the TE cooler 130. The TE cooler controls the temperature of the FPA 110. This method controls the FPA 110 at a substantially constant, stable temperature during transient external environmental ambient temperature excursions. By way of illustration and not limitation, these environmental ambient temperature excursions may range between −55° C. and +80° C. or higher.

The electrical leads 180 carrying signals between the FPA 110 and the detector electronics, 160, 170 may be attached using conventional microelectronics wire bonding techniques. In contrast to the prior art, the electrical leads 180 first connect by intermediate wire bonding to the thermal shunts 140. The thermal shunts 140 then connect by wire bonding to the FPA 110. In one embodiment of the invention, these leads 180 run from the hermetically sealed electrical feedthroughs 152 in the vacuum housing 150 to the bond pads 182 on the thermal shunts 140, and from the thermal shunts 140 to bond pads 182 on the FPA 110. In an alternate embodiment of the invention, the intermediary electrical leads 180 may attach directly to bond pads on the top surface of the TE cooler 130 or thermal spreader 120 without using the thermal shunts 140.

Heat flux transmitted through the electrical leads 180 passes through the thermal shunts 140 and a third thermally conductive attachment 142 to the TE cooler top plate 132. As shown above in one embodiment, the FPA 110 mounts, using a first thermally conducting attachment 112, to the thermal spreader 120. The thermal spreader 120 mounts, using a second thermally conductive attachment 122, to the TE cooler top plate 132. The thermal spreader 120, being highly thermally conductive, and somewhat thermally isolated from the TE cooler 130, prevents the FPA 110 from being drastically affected by the heat flux change transmitted through the electrical leads 180 and shunted to the TE cooler 130.

When the microbolometer FPA assembly 100 undergoes transient external environmental ambient temperature excursions, the temperature difference between the vacuum housing 150, at the external ambient temperature, and the FPA 110 and TE cooler top plate 132, at the constant controlled temperature, causes a heat flux to be transmitted through the electrical leads 180. The heat flux varies proportionally with the change in external ambient temperature.

The combination of one or more thermally conductive planes, the FPA 110, thermal spreader 120 and the TE cooler 130 top plate 132, isolated by a lower thermal conductance thermal interface 122 between them, maintain the portion of the electrical lead connections 182 near the thermal shunts 140 and the FPA 110 at a nearly constant temperature differential. Therefore, the apparatus of the invention allows for nearly constant heat flux transmitted across the FPA 110 and a nearly constant thermal gradient across the FPA 110.

These methods for thermal gradient temperature stabilization employed by the apparatus of the invention allow the microbolometer FPA assembly 100 to be operated without degraded performance over a much wider range of ambient temperature changes than would otherwise be possible.

Figure 4:
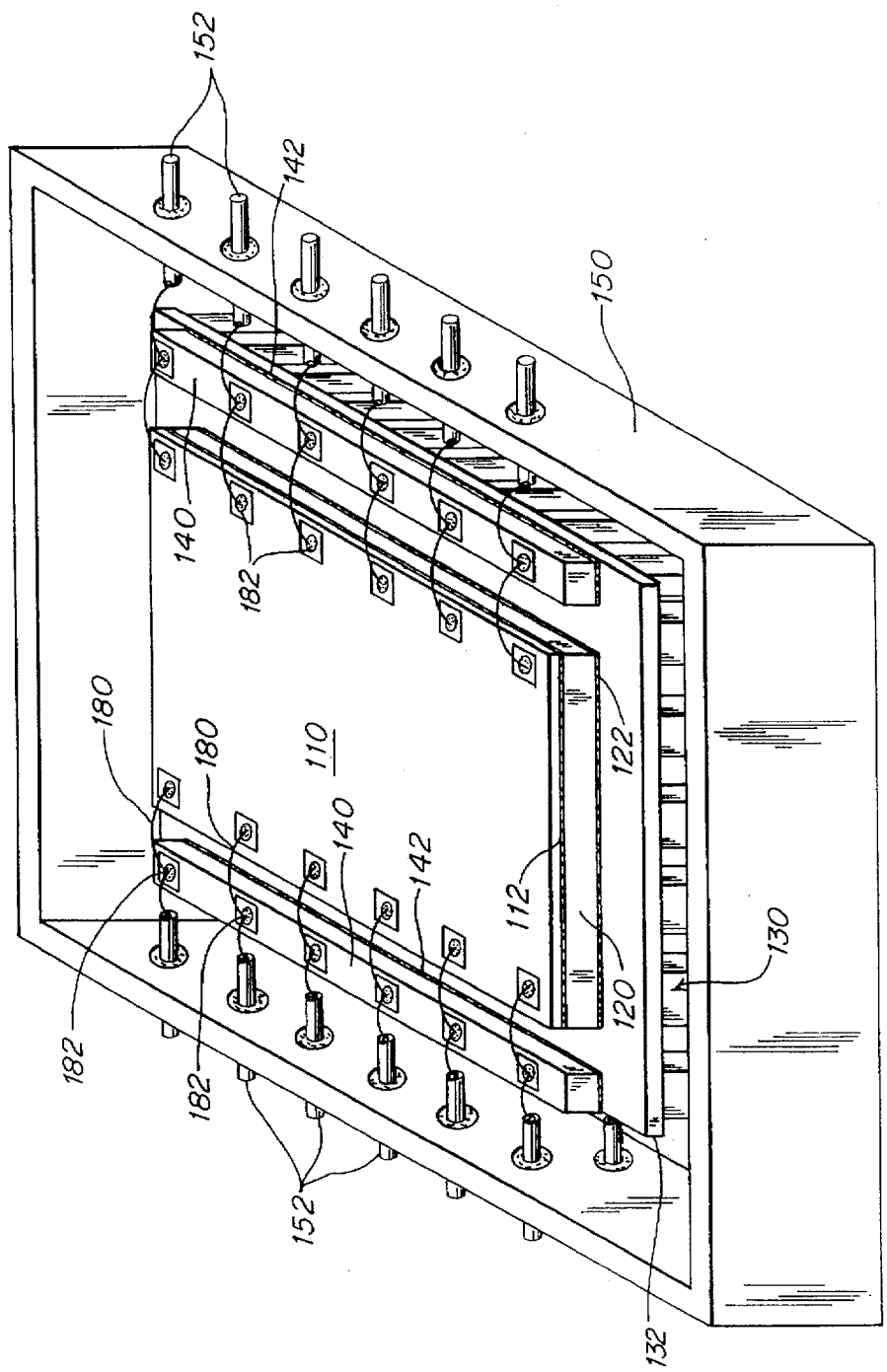
FIG. 4 shows a cutaway view of one embodiment of the microbolometer FPA mounted on the temperature stabilization apparatus in the vacuum housing.

Refer now to FIG. 4 which shows a cutaway view of one embodiment of the microbolometer FPA 110 mounted on the temperature stabilization apparatus 130 in the vacuum housing 150. The first thermally conducting attachment 112 mounts the FPA 110 to the thermal spreader 120. The second thermally conducting attachment 122 mounts the thermal spreader 120 to the TE cooler 130 top plate 132. The third thermally conducting attachment 142 attaches the thermal shunts 140 to the TE cooler 130 top plate 132, that in this example embodiment comprise two shunts 140 mounted parallel to two sides of the FPA 110.

The FPA 110 includes a plurality of electrical leads 180 connected to electrical feedthroughs 152. Thermal shunts 140 provide a thermal sink for the plurality of electrical leads 180 before connection to the electrical feedthroughs 152 to reduce the effect of heat flux transmitted by the electrical leads 180. Bond pads 182 provide a connection from the electrical leads 180 to thermal shunts 140.

The hermetically sealed vacuum housing 150 encloses the FPA 110 and the TE cooler 130. The electrical feedthroughs 152 mount on the vacuum housing 150 and provide connection to off chip electronics.

The invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A temperature stabilization apparatus comprising:
   a) at least one thermally sensitive detector;
   b) a means for stabilizing temperature thermally coupled to the at least one thermally sensitive detector; and
   c) a thermal spreader attached to the at least one thermally sensitive detector by a first thermally conducting attachment, wherein the thermal spreader is coupled to the temperature stabilizing means by a second thermally conducting attachment, wherein the second thermally conducting attachment has a thermal conductance that is less than the thermal conductance of the first thermally conducting attachment.

2. The apparatus of claim 1 wherein the thermal conductance of the second thermally conducting attachment is less than the thermal conductance of the thermal spreader.

3. The apparatus of claim 1 wherein the at least one thermally sensitive detector comprises a focal plane array.

4. The apparatus of claim 3 wherein the focal plane array comprises a microbolometer focal plane array.

5

5. The apparatus of claim 4 further comprising a vacuum housing wherein the temperature stabilization apparatus is attached within the vacuum housing, and wherein the vacuum housing further comprises a window disposed to allow radiation to fall on the focal plane array.

6. The apparatus of claim 5, further comprising at least one thermal shunt coupled to the temperature stabilizing means:
wherein the vacuum housing further comprises at least one hermetically sealed electrical feedthrough connected by a respective intermediate electrical lead to the at least one thermal shunt.

7. The apparatus of claim 6 wherein at least one electrical lead and the respective intermediate electrical lead are wire bonded to the at least one thermal shunt.

8. The apparatus of claim 5 wherein the temperature stabilizing means is attached to the vacuum housing by a third thermally conducting attachment having a thermal conductance similar to the thermal conductance of the first thermally conducting attachment.

9. The apparatus of claim 1 wherein the thermal spreader comprises copper.

10. The apparatus of claim 9 wherein the temperature stabilizing means comprises a thermoelectric cooler having a top plate and wherein the thermal spreader attaches to the top plate.

11. The apparatus of claim 10 wherein the top plate comprises beryllium oxide.

12. The apparatus of claim 1 wherein the second thermally conducting attachment comprises material having a conductance less than 0.1 Watts/cm°K.

13. The apparatus of claim 1 wherein the at least one thermally sensitive detector comprises a two dimensional focal plane array.

14. The temperature stabilization apparatus of claim 1, further comprising at least one thermal shunt thermally coupled to the temperature stabilizing means, wherein the at least one thermal shunt includes a means for carrying a thermally stabilized electrical signal that is electrically connected to the at least one thermally sensitive detector and an electrical terminal.

15. The apparatus of claim 14 further comprising at least one electrical lead attached at a first end to the at least one thermally sensitive detector and at a second end to the at least one thermal shunt.

16. The apparatus of claim 14, wherein the at least one thermal shunt comprises silicon.

17. The temperature stabilization apparatus of claim 1, wherein the means for stabilizing includes a thermoelectric cooler.

18. A focal plane array having a temperature stabilization apparatus comprising:
a) a focal plane array;
b) a thermal spreader attached to the focal plane array by a first thermally conducting attachment;
c) a thermoelectric cooler having a top plate, wherein the thermoelectric cooler is attached to the thermal spreader by a second thermally conducting attachment; and
d) at least one electrical lead attached to the focal plane array wherein the at least one electrical lead is thermally grounded to the thermoelectric cooler.

19. The focal plane array of claim 18, wherein the at least one electrical lead is thermally grounded to the thermoelectric cooler by a silicon bar.

20. A temperature stabilization apparatus for a microbolometer focal plane array comprising:

6 a) a vacuum housing further comprising a window and at least one hermetically sealed electrical feedthrough;
b) a microbolometer focal plane array integrated on a chip enclosed within the vacuum housing, wherein the microbolometer focal plane array is disposed beneath the window to allow radiation to fall on the microbolometer focal plane array;
c) a thermal spreader attached to the microbolometer focal plane array by a first thermally conducting attachment;
d) a thermoelectric cooler having a top plate, wherein the top plate is attached to the thermal spreader by a second thermally conducting attachment that is less thermally conducting than the thermal spreader;
e) at least one thermal shunt attached to the top plate by a third thermally conducting attachment; and
f) at least one electrical lead thermally grounded to a respective one of the at least one thermal shunt, wherein the at least one electrical lead attaches at a first end to the microbolometer focal plane array and at a second end to a respective one of the at least one hermetically sealed electrical feedthrough.

21. The focal plane array of claim 20, wherein the at least one thermal shunt includes a silicon bar.

22. A temperature stabilization apparatus comprising:
a) at least one thermally sensitive detector;
b) a means for stabilizing temperature thermally coupled to the at least one thermally sensitive detector; and
c) a thermal spreader attached to the at least one thermally sensitive detector by a first thermally conducting attachment, wherein the thermal spreader is also coupled to the temperature stabilizing means by a second thermally conducting attachment wherein the second thermally conducting attachment has a thermal conductance that is substantially less than the thermal conductance of the thermal spreader.

23. The temperature stabilization apparatus of claim 22, further comprising an electrical lead, electrically coupled to the at least one thermally sensitive detector and thermally coupled to the means for stabilizing.

24. The temperature stabilization apparatus of claim 23, further comprising a silicon bar that thermally couples the electrical lead to the means for stabilizing.

25. A method for temperature stabilization for at least one thermally sensitive detector, the method comprising the steps of:
a) coupling a cooling source to an intermediate cooling stage via a first thermally conducting attachment; and
b) stabilizing a temperature of at least one thermally sensitive detector by coupling the at least one thermally sensitive detector to the intermediate cooling stage via a second thermally conducting attachment having a thermal conductance that is greater than a thermal conductance of the first thermally conducting attachment.

26. The method of claim 25, further comprising a step of thermally shunting an electrical line that is coupled to the at least one thermally sensitive detector.

27. The method of claim 25 wherein the thermal conductance of the second thermally conducting attachment is greater than a thermal conductance of the intermediate cooling stage.

28. A focal plane array apparatus having a temperature stabilization apparatus comprising:
a) a focal plane array;
b) a thermal spreader attached to the focal plane array by a first thermally conducting attachment; and c) a thermoelectric cooler having a top plate, wherein the thermoelectric cooler is attached to the thermal spreader by a second thermally conducting attachment; wherein the first thermally conducting attachment has a thermal conductance that is greater than a thermal conductance of the second thermally conducting attachment.

29. A focal plane array apparatus having a temperature stabilization apparatus comprising:
 a) a focal plane array;
 b) by a thermal spreader attached to the focal plane array by a first thermally conducting attachment; and
 c) a thermoelectric cooler having a top plate, wherein the thermoelectric cooler is attached to the thermal spreader by a second thermally conducting attachment; wherein the thermal spreader has a thermal conductance that is greater than a thermal conductance of the second thermally conducting attachment.

30. A temperature stabilization apparatus for a microbolometer focal plane array comprising:
 a) a vacuum housing further comprising a window and at least one hermetically sealed electrical feedthrough;
 b) a microbolometer focal plane array integrated on a chip enclosed within the vacuum housing, wherein the microbolometer focal plane array is disposed beneath the window to allow radiation to fall on the microbolometer focal plane array;
 c) a thermal spreader attached to the microbolometer focal plane array by a first thermally conducting attachment; and
 d) a thermoelectric cooler having a top plate, wherein the top plate is attached to the thermal spreader by a second thermally conducting attachment that is less thermally conducting than the first thermally conducting attachment.

31. The temperature stabilization apparatus of claim 30, further comprising an electrical lead, electrically coupled to the microbolometer focal plane array and thermally coupled to the top plate of the thermoelectric cooler.

32. The focal plane array apparatus of claim 30, wherein the thermal spreader has a thermal conductance that is greater than a thermal conductance of the second thermally conducting attachment.

33. A temperature stabilization apparatus comprising:
 a) at least one thermally sensitive detector;
 b) a means for stabilizing temperature thermally coupled to the at least one thermally sensitive detector; and
 c) a thermal spreader attached to the at least one thermally sensitive detector by a first thermally conducting attachment, wherein the thermal spreader is also coupled to the temperature stabilizing means by a second thermally conducting attachment wherein the second thermally conducting attachment has a thermal conductance that is substantially less than the thermal conductance of the first thermally conducting attachment.

34. The temperature stabilization apparatus of claim 33, further comprising an electrical lead, electrically coupled to the at least one thermally sensitive detector and thermally coupled to the means for stabilizing.

35. The temperature stabilization apparatus of claim 34, further comprising a silicon bar that thermally couples the electrical lead to the means for stabilizing.

36. A temperature stabilization apparatus comprising:
 a) at least one thermally sensitive detector;
 b) a thermoelectric cooler coupled to the at least one thermally sensitive temperature stabilizing a thermally sensitive detector, the apparatus comprising:
  means for receiving thermal cooling from a cooling source;
  means for spreading the thermal cooling to provide spread thermal cooling;
  means for compensating for heat flux transmitted to only a portion of the thermally sensitive detector by cooling the thermally sensitive detector via the spread thermal cooling; and
  means for thermally shunting an electrical line that is coupled to the at least one thermally sensitive detector.

37. The temperature stabilization apparatus of claim 36 wherein the thermal conductance of the second thermally conducting attachment is greater than a thermal conductance of the thermal spreader.

38. The temperature stabilization apparatus of claim 36 wherein the at least one thermally sensitive detector comprises a focal plane array.

39. The temperature stabilization apparatus of claim 36, further comprising at least one thermal shunt thermally coupled to the thermoelectric cooler, wherein the at least one thermal shunt includes a means for carrying a thermally stabilized electrical signal that is electrically connected to the at least one thermally sensitive detector and an electrical terminal.

40. The temperature stabilization apparatus of claim 39 wherein the at least one thermal shunt comprises silicon.

41. The temperature stabilization apparatus of claim 40 further comprising at least one electrical lead attached at a first end to the at least one thermally sensitive detector and at a second end to the at least one thermal shunt.

42. An apparatus for temperature stabilizing a thermally sensitive detector, the apparatus comprising:
 means for receiving thermal cooling from a cooling source;
 means for spreading the thermal cooling to provide spread thermal cooling; and
 means for compensating for heat flux transmitted to only a portion of the thermally sensitive detector by cooling the thermally sensitive detector via the spread thermal cooling;
 wherein the means for spreading includes:
  means for coupling the cooling source to an intermediate cooling stage via a first thermally conducting attachment; and
  means for coupling the at least one thermally sensitive detector to the intermediate cooling stage via a second thermally conducting attachment having a thermal conductance that is greater than a thermal conductance of the first thermally conducting attachment.

43. The apparatus of claim 42 wherein the means for spreading includes means for coupling a thermal spreader between the cooling source and the thermally sensitive detector.

44. An apparatus for temperature stabilizing a thermally sensitive detector, the apparatus comprising:
 means for receiving thermal cooling from a cooling source;
 means for spreading the thermal cooling to provide spread thermal cooling;
 means for compensating for heat flux transmitted to only a portion of the thermally sensitive detector by cooling the thermally sensitive detector via the spread thermal cooling; and
 means for thermally shunting an electrical line that is coupled to the at least one thermally sensitive detector.

45. The apparatus of claim 44, wherein means for thermally shunting includes a silicon bar coupled between the electrical line and the cooling source.

46. A method for temperature stabilizing a thermally sensitive detector, the method comprising the steps of:
receiving thermal cooling from a cooling source;
spreading the thermal cooling to provide spread thermal cooling; and compensating for heat flux transmitted to only a portion of the thermally sensitive detector by cooling the thermally sensitive detector via the spread thermal cooling;
wherein the step of spreading includes the steps of:
coupling the cooling source to an intermediate cooling stage via a first thermally conducting attachment; and
coupling the at least one thermally sensitive detector to the intermediate cooling stage via a second thermally conducting attachment having a thermal conductance that is greater than a thermal conductance of the first thermally conducting attachment.

47. The method of claim 46, wherein the step of spreading includes coupling a thermal spreader between the cooling source and the thermally sensitive detector.

48. A method for temperature stabilizing a thermally sensitive detector, the method comprising the steps of:
receiving thermal cooling from a cooling source;
spreading the thermal cooling to provide spread thermal cooling;
compensating for heat flux transmitted to only a portion of the thermally sensitive detector by cooling the thermally sensitive detector via the spread thermal cooling; and
thermally shunting an electrical line that is coupled to the at least one thermally sensitive detector.

49. The method of claim 48, wherein the step of thermally shunting includes coupling a silicon bar between the electrical line and the cooling source.

50. An apparatus for temperature stabilizing a thermally sensitive detector, the apparatus comprising:
a cooling device; and
means, coupled to the cooling device and to the thermally sensitive detector, for spreading thermal cooling provided by the cooling device and for compensating for heat flux transmitted to only a portion of the thermally sensitive detector by cooling the thermally sensitive detector via the spread thermal cooling;
wherein the means for spreading includes:
an intermediate cooling stage coupled to the cooling device via a first thermally conducting attachment; and
a second thermally conducting attachment that couples the at least one thermally sensitive detector to the intermediate cooling stage, the second thermally conducting attachment having a thermal conductance that is greater than a thermal conductance of the first thermally conducting attachment.

51. The apparatus of claim 50, wherein the means for spreading includes a thermal spreader coupled between the cooling source and the thermally sensitive detector.

52. An apparatus for temperature stabilizing a thermally sensitive detector, the apparatus comprising:

a cooling device;
means, coupled to the cooling device and to the thermally sensitive detector, for spreading thermal cooling provided by the cooling device and for compensating for heat flux transmitted to only a portion of the thermally sensitive detector by cooling the thermally sensitive detector via the spread thermal cooling; and
means for thermally shunting an electrical line that is coupled to the at least one thermally sensitive detector.

53. The apparatus of claim 52, wherein the means for thermally shunting includes a silicon bar coupled between the electrical line and the cooling source.

54. A temperature stabilization apparatus comprising:
at least one thermally sensitive detector comprising a focal plane array;
a means for stabilizing temperature thermally coupled to the at least one thermally sensitive detector;
at least one thermal shunt thermally coupled to the temperature stabilizing means wherein the at least one thermal shunt includes a means for carrying a thermally stabilized electrical signal that is electrically connected to the at least one thermally sensitive element and an electrical terminal; and
a thermal spreader attached to the at least one thermally sensitive element by a first thermally conducting attachment, wherein the thermal spreader is coupled to the temperature stabilizing means by a second thermally conducting attachment, wherein the second thermally conducting attachment has a thermal conductance that is less than the thermal conductance of the thermal spreader.

55. The apparatus of claim 54 wherein the focal plane array comprises a microbolometer focal plane array.

56. The apparatus of claim 55 further comprising a vacuum housing wherein the temperature stabilization apparatus is attached within the vacuum housing, and wherein the vacuum housing further comprises a window disposed to allow radiation to fall on the focal plane array.

57. The apparatus of claim 56, wherein the vacuum housing further comprises at least one hermetically sealed electrical feedthrough connected by a respective intermediate electrical lead to the at least one thermal shunt.

58. The apparatus of claim 57 wherein at least one electrical lead and the respective intermediate electrical lead are wire bonded to the at least one thermal shunt.

59. The apparatus of claim 56 wherein the temperature stabilizing means is attached to the vacuum housing by a third thermally conducting attachment having a thermal conductance similar to the thermal conductance of the first thermally conducting attachment.

60. The apparatus of claimed 54 wherein the thermal conductance of the first thermally conducting attachment is greater than the thermal conductance of the second thermally conducting attachment.

61. The apparatus of claim 54 wherein the at least one thermal shunt includes a silicon bar.

* * * * *